United States Patent
Uozumi et al.

(10) Patent No.: US 7,423,493 B2
(45) Date of Patent: *Sep. 9, 2008

(54) WIRELESS COMMUNICATION SEMICONDUCTOR INTEGRATED CIRCUIT DEVICE AND MOBILE COMMUNICATION SYSTEM

(75) Inventors: Toshiya Uozumi, Komoro (JP); Hirotaka Osawa, Isesaki (JP); Jiro Shinbo, Takasaki (JP); Satoru Yamamoto, Takasaki (JP)

(73) Assignee: Renesas Technology Corporation, Tokyo (JP)

( * ) Notice: Subject to any disclaimer, the term of this patent is extended or adjusted under 35 U.S.C. 154(b) by 14 days.

This patent is subject to a terminal disclaimer.

(21) Appl. No.: 11/501,778

(22) Filed: Aug. 10, 2006

(65) Prior Publication Data

US 2006/0267699 A1   Nov. 30, 2006

Related U.S. Application Data

(63) Continuation of application No. 10/945,915, filed on Sep. 22, 2004, now Pat. No. 7,123,102.

(30) Foreign Application Priority Data

Sep. 29, 2003   (JP)   ............................. 2003-337000

(51) Int. Cl.
*H03L 7/18* (2006.01)

(52) U.S. Cl. ........................... 331/34; 331/44; 331/179; 331/16

(58) Field of Classification Search ................... 331/16, 331/17, 34, 44, 179
See application file for complete search history.

(56) References Cited

U.S. PATENT DOCUMENTS

| | | | | |
|---|---|---|---|---|
| 6,154,095 A | * | 11/2000 | Shigemori et al. | ............ 331/16 |
| 2002/0075080 A1 | * | 6/2002 | Nelson et al. | ................. 331/11 |
| 2003/0183842 A1 | * | 10/2003 | Kizer et al. | ................. 257/158 |

FOREIGN PATENT DOCUMENTS

JP   2003152535   5/2003

* cited by examiner

*Primary Examiner*—Joseph Chang
(74) *Attorney, Agent, or Firm*—Mattingly, Stanger, Malur & Brundidge, P.C.

(57) ABSTRACT

An RF IC in which a PLL circuit including a loop filter is incorporated into a semiconductor chip is achieved without increasing power consumption or chip size. The RF IC includes a VCO capable of switching oscillation frequency bands, a variable frequency divider, a phase comparator, and a loop filter, which are contained in the PLL loop. A discrimination circuit discriminates a lead or lag in a phase of an output signal from the variable frequency divider against a reference signal and an automatic band selecting circuit generates a signal for switching the frequency bands of the VCO based on output from the discrimination circuit. While switching the frequency bands of the VCO by means of bisection algorithm, the RF IC detects an optimum frequency band, and adds offset to it to determine a final usable frequency band.

18 Claims, 8 Drawing Sheets

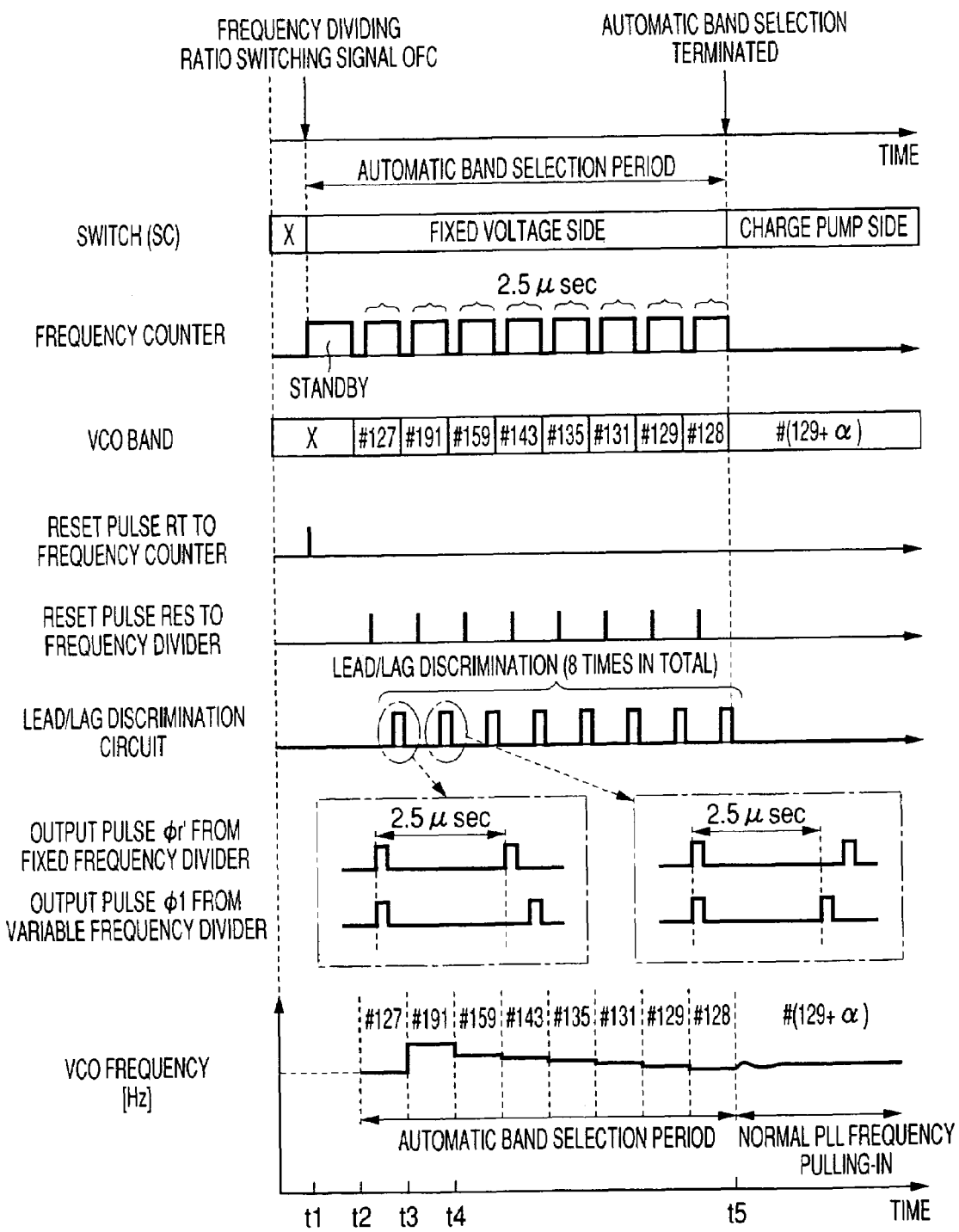

WIRELESS COMMUNICATION SEMICONDUCTOR INTEGRATED CIRCUIT DEVICE AND MOBILE COMMUNICATION SYSTEM

CROSS REFERENCE TO RELATED APPLICATION

The present application is a continuation of application Ser. No. 10/945,915, filed Sep. 22, 2004, now U.S. Pat. No. 7,123,102 which claims priority from the Japanese patent application No. 2003-337000, filed Sep. 29, 2003, the content of which are incorporated herein by reference into this application.

BACKGROUND OF THE INVENTION

The present invention relates to a technique effective in application to a semiconductor integrated circuit device incorporating a PLL (phase locked loop) circuit, specifically to a technique effective in use for a radio frequency semiconductor integrated circuit device incorporating a PLL circuit that generates a predetermined frequency oscillation signal synthesized with a reception signal or a transmission signal for a wireless communication, and a mobile communication system containing the same.

In a wireless communication system such as a mobile telephone, a radio frequency semiconductor integrated circuit device (hereunder, referred to as an RF IC) is used which incorporates a PLL circuit including an oscillator that generates a local oscillation signal of a predetermined frequency, being synthesized with a reception signal or a transmission signal, and modulates the transmission signal and demodulates the reception signal. Conventionally, comparably many mobile telephones have supported the so-called dual band system, which can handle signals of two frequency bands, such as a signal of the GSM (Global System for Mobile Communication) covering the band 880 MHz through 915 MHz, and a signal of the DCS (Digital Cellular System) covering the band 1710 MHz through 1785 MHz. Some of the mobile telephones supporting this dual band system are made up to handle the two bands with one PLL circuit by switching the frequency of the PLL circuit.

In recent years, however, there arises a demand for a mobile telephone of the triple band system that can handle a signal of the PCS (Personal Communication System) covering the band 1850 MHz through 1915 MHz in addition to the GSM and DCS.

These circumstances conceivably lead to a demand for mobile telephones that can handle still more systems. A voltage-controlled oscillator (VCO) being used in a mobile telephone that can handle such plural systems is required to have a wide oscillation frequency range. Here, if one VCO tries to cover all the frequencies, the sensitivity of the oscillation frequency against the control voltage of the VCO (hereunder, referred to as the control sensitivity) becomes higher, and the VCO becomes weaker to external noises and fluctuations of the power supply voltage.

In order to solve the above deficiency, a trial is made in the invention (Patent Reference 1), which switches a VCO into multiple frequency bands (16 bands) to thereby reduce the control sensitivity of the VCO, while maintaining a desired oscillation frequency range. This prior invention adopts a system to determine an optimum frequency band for use. This system measures, in advance before starting the operation, the actual frequencies on all the frequency bands of the VCO, stores the measurements in a memory, and when oscillation frequency information is given, the oscillation frequency information is compared with the frequency measurements stored in the memory to determine the optimum frequency band.

Now in the mobile telephone, in recent years have been made many efforts that incorporate as many circuits as possible into one or few semiconductor integrated circuit devices, in order to achieve downsizing of the devices and lower the cost by reducing the number of components. In an example, a trial is made to incorporate a loop filter provided on the loop of a PLL circuit contained in an RF IC into a semiconductor chip.

[Patent Reference 1] Japanese Unexamined Patent Publication No. 2003-152535

Now, the loop filter of a PLL circuit is composed of capacitive elements and resistive elements. Conventionally, the loop filter has usually been made up with externally attached elements. The reason is that an effort to attain capacitive elements having capacitances necessary for a desired characteristic on a chip ends up in confirming the necessity of an extraordinary large area for the elements on the chip. Now, to decrease the capacitances is needed to increase the resistances of the resistive elements. However, to increase the resistances will increase the thermal noises by the resistive elements. In the PLL circuit, the voltage from the loop filter is directly applied to the control terminal of the VCO. Therefore, if the thermal noises by the resistive elements constituting the loop filter are high, and the control sensitivity of the VCO is high, the thermal noises generated by the resistive elements will appear on the output of the VCO.

SUMMARY OF THE INVENTION

In order to solve this deficiency, the inventors of this invention examined the following: increasing the oscillation frequency bands of the VCO further more, decreasing the ratio of an oscillation frequency variation against a control voltage variation in each frequency band, thereby reducing the control sensitivity of the VCO, thus making it difficult for the influence of the thermal noises to appear on the output of the VCO, even if the resistances of the resistive elements constituting the loop filter are increased.

The examination result is as follows. In such a system as disclosed in the Patent Reference 1 that measures the actual frequencies on all the frequency bands in advance and stores the measurement results in a memory in order to determine a usable oscillation frequency band in the VCO capable of switching the oscillation frequency bands, there is a possibility of causing an increase of the chip size, because further increasing the frequency bands of the VCO elongates the measuring time further more to increase the power consumption, and it also requires expanding the capacity of the memory for storing the measurement results. Therefore, in the case the VCO has a large number of frequency bands, there is a possibility that the system to determine the usable frequency band as proposed in the Patent Reference 1 is not appropriate.

It is therefore an object of the invention to provide an RF IC capable of precise oscillations over a wide frequency range, in which the control sensitivity of the VCO is lowered and the PLL loop is not susceptive to the influence of the external noises. Another object of the invention is to provide an RF IC that incorporates a PLL circuit including the loop filter into a semiconductor chip, without increasing the power consumption without expanding the chip size.

Another object of the invention is to provide a mobile telephone and other wireless communication systems that can reduce the number of components and downsize the device, and that can elongate the maximum call time and the maximum standby time.

The foregoing and other objects and novel features of the invention will become apparent from the descriptions and appended drawings of this specification.

According to one aspect of the invention, the RF IC includes a VCO capable of switching oscillation frequency bands, a variable frequency divider, a phase comparator, and a loop filter, which are contained in the PLL loop. The RF IC further includes a switch capable of supplying a predetermined fixed voltage to the VCO with the loop open, a discrimination circuit that discriminates the lead or lag in the phase of an output signal from the variable frequency divider against a reference signal of a predetermined frequency, an automatic band selecting circuit that generates a signal for switching the frequency bands of the VCO based on the output from the discrimination circuit, an offset imparting circuit that supplies an offset so as to correct a discrepancy in the phase discrimination based on the signal delay, a register to which information indicating an offset quantity in the offset imparting circuit is set. While switching the frequency bands of the VCO by means of the bisection algorithm, the RF IC detects an optimum frequency band, and adds the offset to it to determine a final usable frequency band.

According to the above means, it is possible to determine a usable frequency band within a comparably short time, even if the frequency bands of the VCO are increased and the control sensitivity is lowered. If there is a discrepancy in the timing between the signals inputted to the discrimination circuit, resulting from the difference of the signal paths and so forth, the offset imparting circuit gives an offset so as to correct the discrepancy. Therefore, it is possible to select an optimum usable frequency band to thereby achieve a high-precision oscillation control.

According to the above means, it becomes easy to incorporate the loop filter into a semiconductor chip. Conventionally, externally attached elements are used in the loop filter, since the capacitances of the loop filter are too large to incorporate the capacitive elements into a chip. In order to incorporate the capacitive elements of the loop filter into a chip without changing the characteristic of the filter, it is only needed to decrease the capacitances and increase the resistances of the resistive elements constituting the loop filter. To increase the resistances will cause a possibility of increasing the thermal noises by the resistive elements. According to the above means, it is possible to reduce the control sensitivity of the VCO, which makes it possible to suppress the noises appeared on the output of the VCO. It is accordingly possible to increase the resistances of the resistive elements constituting the loop filter, and to decrease the capacitances of the capacitive elements to that extent, which makes it possible to form the loop filter on one chip.

According to the invention, the RF IC is able to perform a precise oscillation operation over a wide frequency range, since the VCO is configured to have multi-bands. Having multi-bands, the PLL circuit can reduce the control sensitivity of the VCO, which makes the PLL loop un-susceptive to the influence of the noises. That is, increasing the resistances and decreasing the capacitances in the loop filter does not make the PLL loop susceptive to the influence of the thermal noises generated by the resistive elements. Therefore, it becomes easy to incorporate a PLL circuit including a loop filter into one semiconductor chip.

The PLL circuit of the RF IC is configured to detect an optimum frequency band while switching the frequency bands of the VCO by means of the bisection algorithm.

Accordingly, to measure all the oscillation frequencies of the frequency bands in advance and store them in a memory is not necessary. Therefore, if the VCO is made up in multi-bands of more than 100 bands, it does not take much time for determining a usable frequency band. As the result, there is no possibility that the power consumption of the circuit increases, and/or the chip size expands.

Further, by incorporating the loop filter into one chip, the total number of components becomes decreased, and the downsizing becomes possible. Because of decreased power consumption, it is possible to implement a mobile telephone and other wireless communication systems that can elongate the maximum call time and the maximum standby time.

BRIEF DESCRIPTION OF THE DRAWINGS

FIG. 4 is a timing chart illustrating the operation timing in the band selection of the PLL circuit in FIG. 1;

FIG. 5 is a timing chart illustrating the reset timing of a variable frequency divider and a fixed frequency divider during the band selection, in which

DETAILED DESCRIPTION OF THE PREFERRED EMBODIMENTS

The preferred embodiments will now be described with reference to the accompanying drawings.

Figure 1:
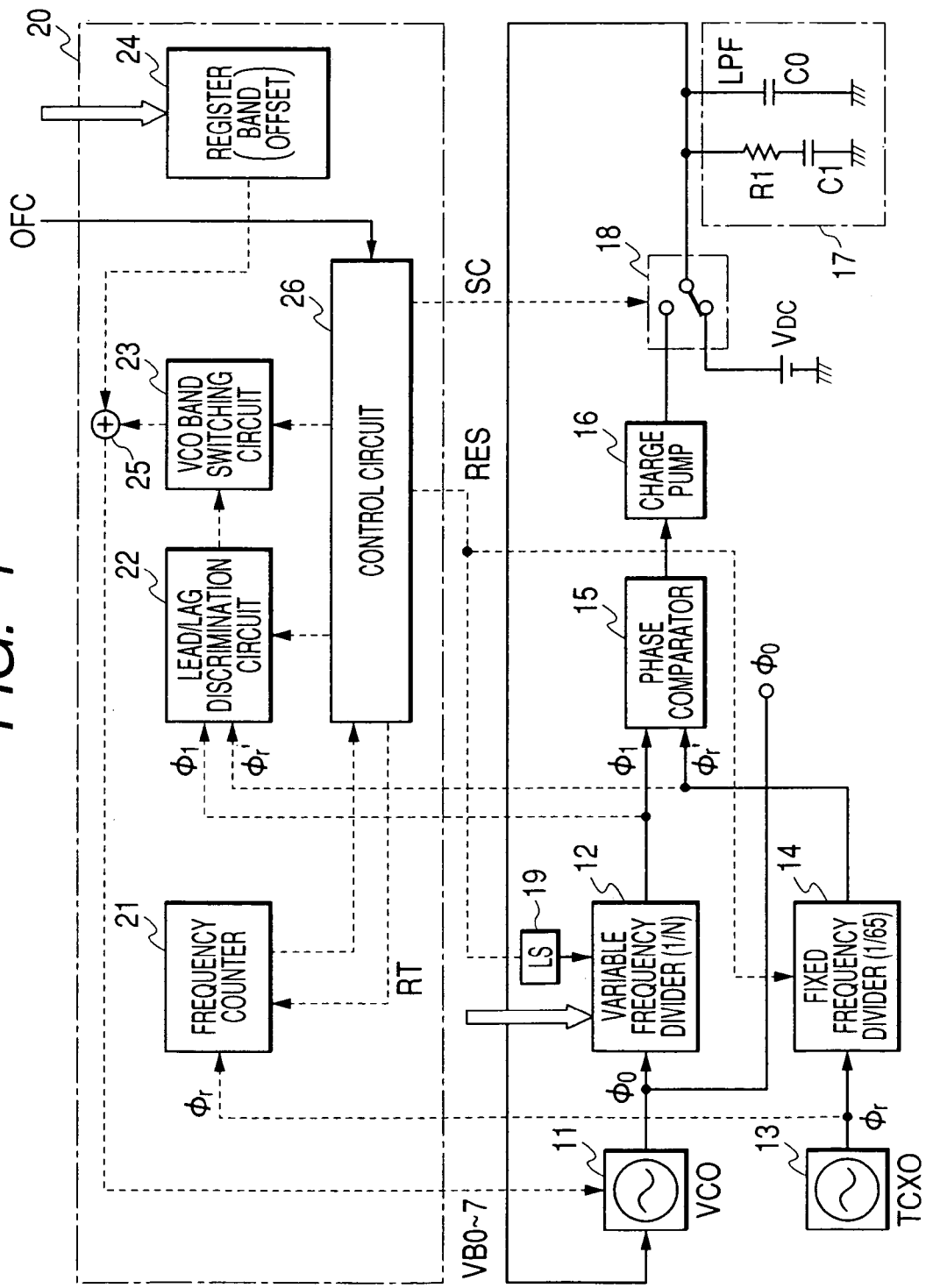
FIG. 1 is a block diagram illustrating one embodiment of the PLL circuit relating to the invention.

FIG. 1 illustrates one embodiment of the PLL circuit relating to the invention, which contains the function that automatically selects a usable band of the VCO based on the externally set frequency information.

The PLL circuit of this embodiment includes a voltage controlled oscillator (VCO) 11, a variable frequency divider 12 that divides the frequency of an oscillation signal $\Phi 0$ from the VCO into 1/N the frequency, a fixed frequency divider 14 that divides the frequency of 26 MHz, for example, of a reference oscillation signal $\Phi r$ from a reference frequency oscillator 13 to generate the reference oscillation signal $\Phi r$, a phase comparator 15 that detects the phase difference between a signal $\Phi 1$ acquired by the variable frequency divider 12 dividing the frequency of the oscillation signal $\Phi 0$ and a signal $\Phi r$ acquired by the fixed frequency divider 14 dividing the frequency of the reference oscillation signal $\Phi r$, a charge pump 16 that generates a charge current or a discharge current according to a detected phase difference, and a loop filter 17 that generates a voltage according to an output current from the charge pump 16. The voltage smoothed by the loop filter 17 is fed back to the VCO 11 as an oscillation control voltage Vt.

The VCO 11 has 256 frequency bands (hereunder, simply referred to as bands) in the embodiment, which is not specifically restricted. The fixed frequency divider 14 has the frequency-dividing ratio 1/65, and divides the frequency 26 MHz of the reference oscillation signal Φref to generate a signal of 400 kHz. The loop filter 17 is a second order filter made up with a capacitor C0, a resistor R1, and a capacitor C1, in which the resistor R1 and capacitor C1 are laid down in parallel to the capacitor C0. The resistor R1, capacitor C0, and capacitor C1 are the elements that are formed on a semiconductor chip.

Further, the PLL circuit of this embodiment includes a switch 18 capable of supplying a fixed voltage VDC being almost half the control voltage Vt in replacement of the current from the charge pump 16, which is inserted between the charge pump 16 and the loop filter 17. The PLL circuit also includes an automatic band selecting circuit 20 that generates a switching signal for switching a usable band of the VCO 11 by comparing an output from the variable frequency divider 12 and an output from the fixed frequency divider 14. Here in this embodiment, the phase comparator 15 and the charge pump 16 are separately provided, but there can be a circuit configuration such that the output stage of the phase comparator 15 operates as the current source of the charge pump. In such a case, the charge pump is not necessary.

The automatic band selecting circuit 20 includes a frequency counter 21 that counts the reference oscillation signal Φr from the reference frequency oscillator 13 and clocks time as a timer, a discrimination circuit 22 that compares the phase of the output Φ1 from the variable frequency divider 12 with the phase of the output Φr from the fixed frequency divider 14, and discriminates whether the phase of the output Φ1 is in lead or lag to the phase of the output □r', a band switching circuit 23 that generates band switching control signals VB0 through VB7 for switching the bans of the VCO 11 according to discrimination results by the discrimination circuit 22, a register 24 that retains offsets set by external units, an adder 25 as an offset imparting circuit that adds the band switching control signals VB0 through VB7 outputted from the band switching circuit 23 to the offsets being retained in the register 24 and supplies the result to the VCO 11, and a control circuit 26 that controls to operate the switch 18, frequency counter 21, discrimination circuit 22, band switching circuit 23, register 24, and adder 25 in a predetermined order, and controls to determine a usable band.

The control circuits 26 is also designed to generate a reset signal RT for resetting the frequency counter 21, and a reset signal RES for resetting the variable frequency divider 12 and fixed frequency divider 14. Here, a level shifter 19 that converts the level of the reset signal RES is inserted between the control circuit 26 and the variable frequency divider 12.

Figure 2:
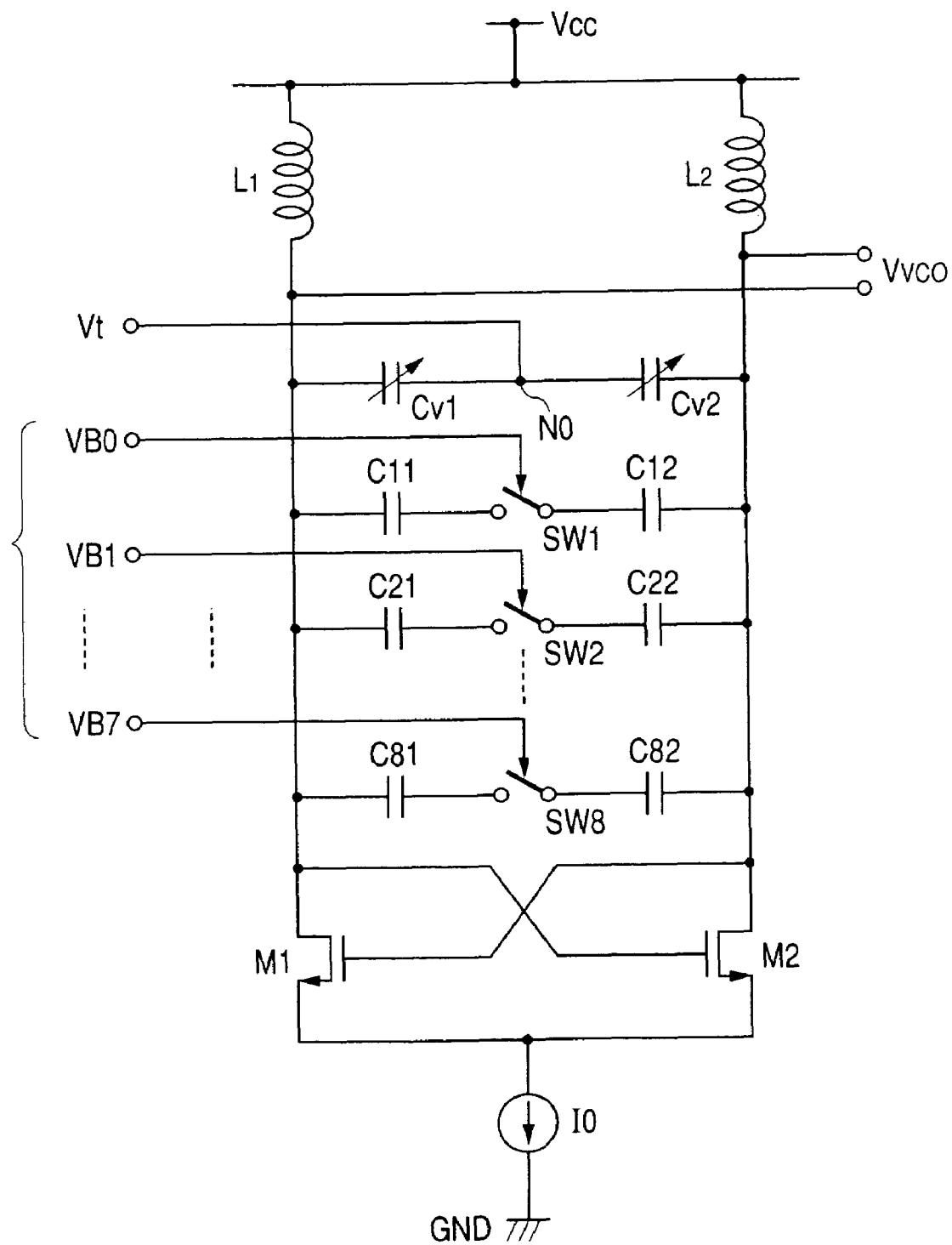
FIG. 2 illustrates an example of the voltage-controlled oscillator (VCO) contained in the PLL circuit of the embodiment in FIG. 1.

FIG. 2 illustrates a circuit configuration of the VCO (voltage-controlled oscillator) 11 used in this embodiment.

The VCO is an LC resonant type oscillator, and it includes a pair of N-channel MOS transistors M1, M2, the sources of which are commonly connected, and the gates and drains of which are cross-coupled each other, a constant current source 10 connected to bridge the common source of the transistors M1, M2 and the ground GND, inductors L1, L2 each connected between the drain of each of the transistors M1, M2 and a power supply terminal Vcc, variable capacitors Cv1, Cv2 connected in series to bridge the drain terminals of the transistors M1, M2, which are made up with varactor diodes, a capacitor C11-switch SW1-capacitor 12 connected in series to bridge the drain terminals of the transistors M1, M2, and a capacitor C21-SW2-capacitor 22, a capacitor C31-SW3-capacitor 32, ..., and a capacitor C81-SW8-capacitor 82, which are connected in parallel to the capacitor C11-SW1-capacitor 12.

In this VCO, the control voltage Vt from the loop filter 17 in FIG. 1 is applied to a node NO where the variable capacitors Cv1, Cv2 are connected, so as to vary the oscillation frequency continuously. To the switches SW1 to SW8 are supplied the band switching control signals VB0 through VB7 from the automatic band selecting circuit 20. By switching the band switching control signals VB0 through VB7 into the High level or Low level, the oscillation frequency of the VCO is altered into frequencies of 256 phases.

The capacitors C11 and C12 have an identical capacitance, in the same manner, C21 and C22, C31 and C32, C41 and C42, C51 and C52, C61 and C62, C71 and C72, and C81 and C82 each have an identical capacitance. Here, the capacitances of C11, C21, C31, C41, C51, C61, C71, and C81 are set to have the weightings of the m-th power of 2 (m: 0, 1, 2, 3, ... 7). The combined capacitance C is controlled to vary in 256 phases according to the combinations of the band switching control signals VB0 through VB7, and the VCO 11 is controlled to operate on any one of 256 frequency characteristics of bands #0 through #255, as shown in FIG. 3.

Figure 3:
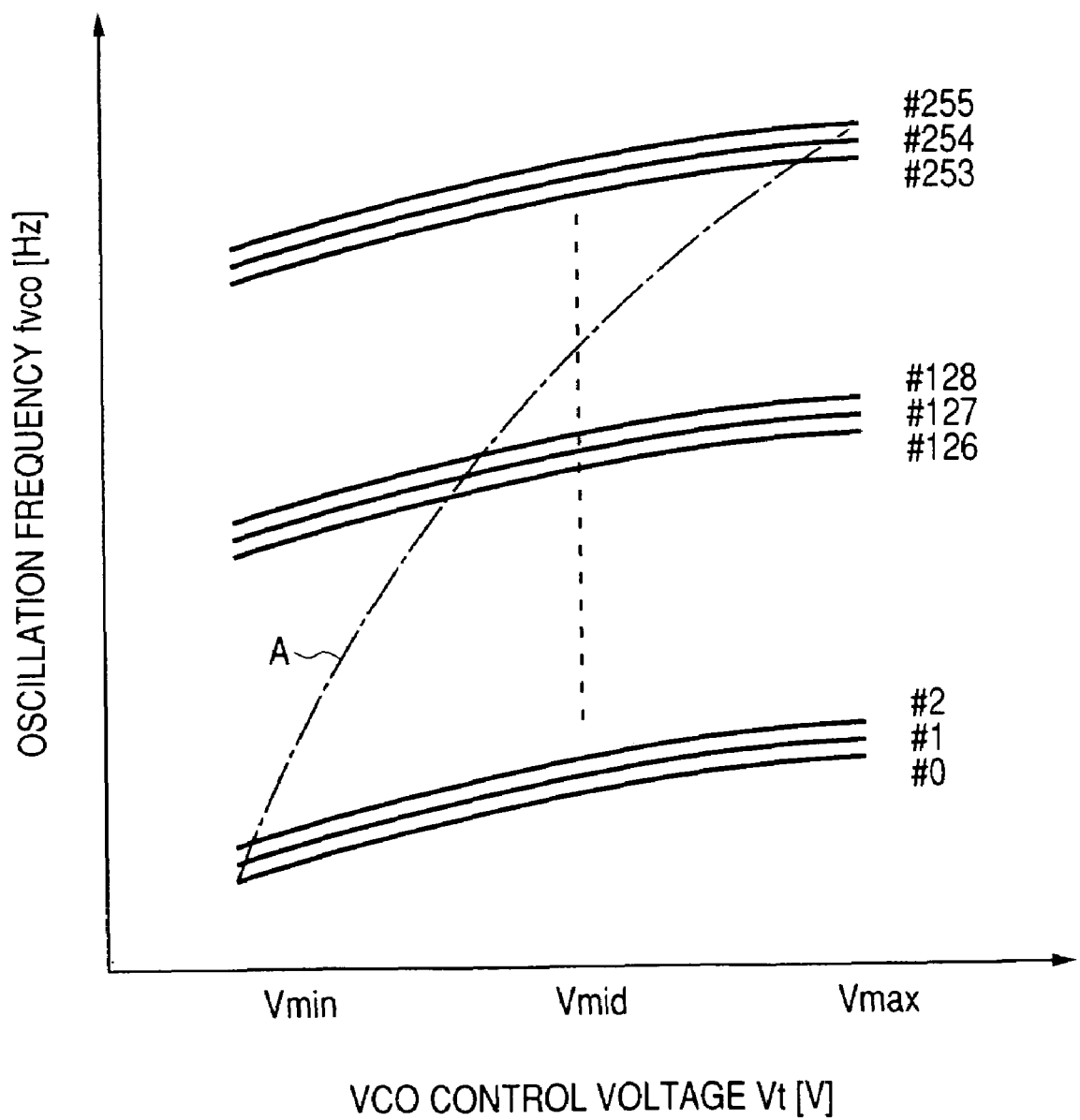
FIG. 3 is a chart illustrating the relation between the control voltage Vt and the oscillation frequency fVCO of the VCO in FIG. 2.

When it is desired to widen the frequency coverage of the VCO, and if it is carried out by means of only the capacitance variations of the varactor diodes by the control voltage Vt, the characteristic curve Vt-fvco becomes sharp, as shown by an alternate long and short dash line in FIG. 3. Consequently, the sensitivity of the VCO, namely, the ratio of the frequency variation against the control voltage variation ($\Delta f/\Delta Vt$) becomes high, and the VCO becomes susceptive to external noises. In other wards, a slight superposition of noises on the control voltage will greatly vary the oscillation frequency of the VCO.

In order to solve this problem, the VCO of this embodiment is provided with plural capacitive elements in parallel to the capacitive elements constituting the LC resonant oscillator. The band switching control signals VB0 through VB7 switch the form of connection of the capacitive elements into 256 configurations, which alters the value of the combined capacitance C into 256 steps. Thereby, the VCO 11 attains the oscillation frequency control according to the 256 Vt-fvco characteristic curves, as shown by the solid lines in FIG. 3, and it is able to operate to select any one of the 256 characteristics in correspondence with the band to be used.

In the LC resonant type oscillator of this embodiment, the capacitors C11 through C82 are made of capacitances formed by a laminated structure of metal film-insulating film-metal film on a semiconductor substrate. Therefore, to appropriately set the area ratio of the electrodes of the capacitors C11 through C82 will make it possible to attain a desired capacitance ratio (m-th power of 2). Hereunder, the capacitors C11 through C82 will be called the band switching capacitors. The capacitors C11 through C82 may use the capacitances between the gate electrodes and the substrate of an MOS transistor. The inductors L1 and L2 use on-chip elements made of an aluminum layer formed on the semiconductor substrate, but they may use externally attached elements.

Next, the process of determining a selective band by the automatic band selecting circuit 20 of the PLL circuit in FIG. 1 will be described with reference to the timing chart in FIG. 4.

A signal OFC instructing to switch the oscillation frequency is supplied to the control circuit 26 from the outside. Then, a switching signal SC for switching the switch 18 into the fixed voltage VDC and the reset signal RT for resetting the frequency counter 21 are outputted from the control circuit 26. At the same time, the frequency-dividing ratio "N" of the variable frequency divider 12 supplied from the outside is set to the variable frequency divider 12 (timing t1). This frequency-dividing ratio "N" corresponds to the oscillation frequency information. As the switch 18 is switched into the fixed voltage VDC, the fixed voltage VDC is supplied to the VCO 11 as the control voltage Vt, and the VCO 11 starts the oscillation at the frequency corresponding to the fixed voltage VDC.

After receiving the reset signal, the frequency counter 21 starts a precise clock operation by the reference oscillation signal Φr from the reference frequency oscillator 13; as 5 µs elapses, the frequency counter 21 sends an elapsed time signal to the control circuit 26. This elapsed time 5 µs is equivalent to the time required for stabilizing the voltage of the loop filter 17 to the fixed voltage VDC. As 5 µs elapses, the control circuit 26 supplies the band switching circuit 23 with a signal that instructs to send the control signals VB0 through VB7 to the VCO 11. Thereby, the VCO 11 designates selectively connected capacitive elements, that is, a selective band (timing t2). Here, the band designated at first is the central band #127 among 256 bands of #0 through #255.

Next, after waiting for a short time (for example, 0.5 µs) necessary for the band switching in the VCO 11, the control circuit 26 sends the reset signal RES, which is pulse-formed, to the variable frequency divider 12 and fixed frequency divider 14. The variable frequency divider 12 and fixed frequency divider 14 both are a counter circuit. After being reset to '0' temporarily by the reset signal RES, and being released from this resetting, the variable frequency divider 12 and fixed frequency divider 14 start counting. When counting the frequency dividing ratio 'N' and '65', the dividers 12 and 14 output the pulses Φ1 and Φr', respectively. Since the fixed frequency divider 14 operates according to the reference oscillation signal □r from the reference frequency oscillator 13 (quartz oscillator) that generates a very accurate frequency (26 MHz), the frequency of the output pulse Φr' is precisely 400 kHz, and the cycle thereof is 2.5 µs. These output pulses Φ1 and Φr' are supplied to the discrimination circuit 22. The discrimination circuit 22 discriminates whether the rise of the output pulse Φ1 from the variable frequency divider 12 is in lead or lag to the rise of the output pulse Φr' from the fixed frequency divider 14.

If the discrimination circuit 22 discriminates that the rise of the output pulse Φ1 from the variable frequency divider 12 is in lag, the discrimination circuit 22 will supply the band switching circuit 23 with a signal that commands to send the band switching control signals VB0 through VB7 designating a band of a higher frequency than the current to the VCO 11 (timing t3). On the contrary, if the discrimination circuit 22 discriminates that the rise of the output pulse Φ1 is in lead, the discrimination circuit 22 will supply the band switching circuit 23 with a signal that commands to send the band switching control signals VB0 through VB7 designating a band of a lower frequency than the current to the VCO 11. The band designated by the second signal of the band switching control signals VB0 through VB7 is the band #191 in the center of #127 and #255 when the rise of the output pulse Φ1 is in lag; and it is the band #63 in the center of #127 and #0 when the rise of the output pulse Φ1 is in lead.

As the band switching command is executed, the control circuit 26 sends the reset signal RES again to the variable frequency divider 12 and fixed frequency divider 14, after waiting for a short time (for example, 0.5 µs) necessary for the band switching in the VCO 11. After being reset to '0' temporarily, the variable frequency divider 12 and fixed frequency divider 14 resumes counting. When counting the frequency dividing ratio 'N' and '65', the dividers 12 and 14 output the pulses Φ1 and Φr', respectively. The discrimination circuit 22 discriminates whether the rise of the output pulse Φ1 from the variable frequency divider 12 is in lead or lag to the rise of the output pulse Φr' from the fixed frequency divider 14.

If the discrimination circuit 22 discriminates that the rise of the output pulse Φ1 is in lag, the discrimination circuit 22 will supply the band switching circuit 23 with a signal that commands to send the band switching control signals VB0 through VB7 designating a band of a higher frequency than the current to the VCO 11 (timing t4). On the contrary, if the discrimination circuit 22 discriminates that the rise of the output pulse Φ1 of the variable frequency divider 12 is in lead, the discrimination circuit 22 will supply the band switching circuit 23 with a signal that commands to send the band switching control signals VB0 through VB7 designating a band of a lower frequency than the current to the VCO 11. The band designated by the third signal of the band switching control signals VB0 through VB7 is the band #159 in the center of #127 and #191, the band #123 in the center of #191 and #255, the band #95 in the center of #127 and #63, or the band #31 in the center of #63 and #0.

By repeating the above operation eight times, a band is selected among the 256 bands (timing t5), which is most appropriate for the designated oscillation frequency (the frequency corresponding to the set frequency-dividing ratio N). At the eighth discrimination, a band selected at the seventh discrimination or a band higher by one is selected (or, a band lower by one is possible). In the automatic band selecting circuit 20 of this embodiment, an offset is further added to the band selected at the eighth discrimination to determine the final selective band. This offset is to correct a discrimination error resulting from a discrepancy in the actual reset operation by the reset signal RES, between the variable frequency divider 12 and the fixed frequency divider 14.

The discrepancy in the reset operation between the variable frequency divider 12 and the fixed frequency divider 14 has two factors in this embodiment. The first factor to cause the discrepancy is that the reset signal RES outputted from the control circuit 26 is supplied to the variable frequency divider 12 by way of the level shifter 19 that converts the CMOS level into the ECL level, whereas the reset signal RES is supplied to the fixed frequency divider 14 directly without a level conversion.

The reason why the level conversion is required for the reset signal RES supplied to the variable frequency divider 12, whereas the level conversion is not required for the reset signal RES supplied to the fixed frequency divider 14 is as follows. That is, the frequency of the oscillation signal from the VCO 11, which the variable frequency divider 12 divides, is the order of GHz (Giga Hertz). This frequency is much higher than the reference oscillation frequency (26 MHz) that the fixed frequency divider 14 divides; accordingly, the variable frequency divider 12 is made up with an ECL circuit including bipolar transistors that perform a higher speed operation than MOSFETs. On the other hand, the fixed frequency divider 14 is made up with a CMOS circuit to reduce the power consumption. The circuit configuration of the variable frequency divider 12 will be described with reference to FIG. 7.

The second factor to cause the discrepancy in the reset operation between the variable frequency divider 12 and the fixed frequency divider 14 is a difference of delay resulting from that the supply path of the reset signal RES from the control circuit 26 to the variable frequency divider 12 is longer than the path from the control circuit 26 to the fixed frequency divider 14. Here, the reason why there occurs a difference of length between the two supply paths of the reset signal RES is in general that either of the frequency dividers is closer to the control circuit. Since the frequency counter 21 and the fixed frequency divider 14 share part of the circuits in this embodiment, the fixed frequency divider 14 is necessarily laid out closer to the control circuit 26 than the variable frequency divider 12. The reason will be explained concretely with FIG. 6.

Figure 6:
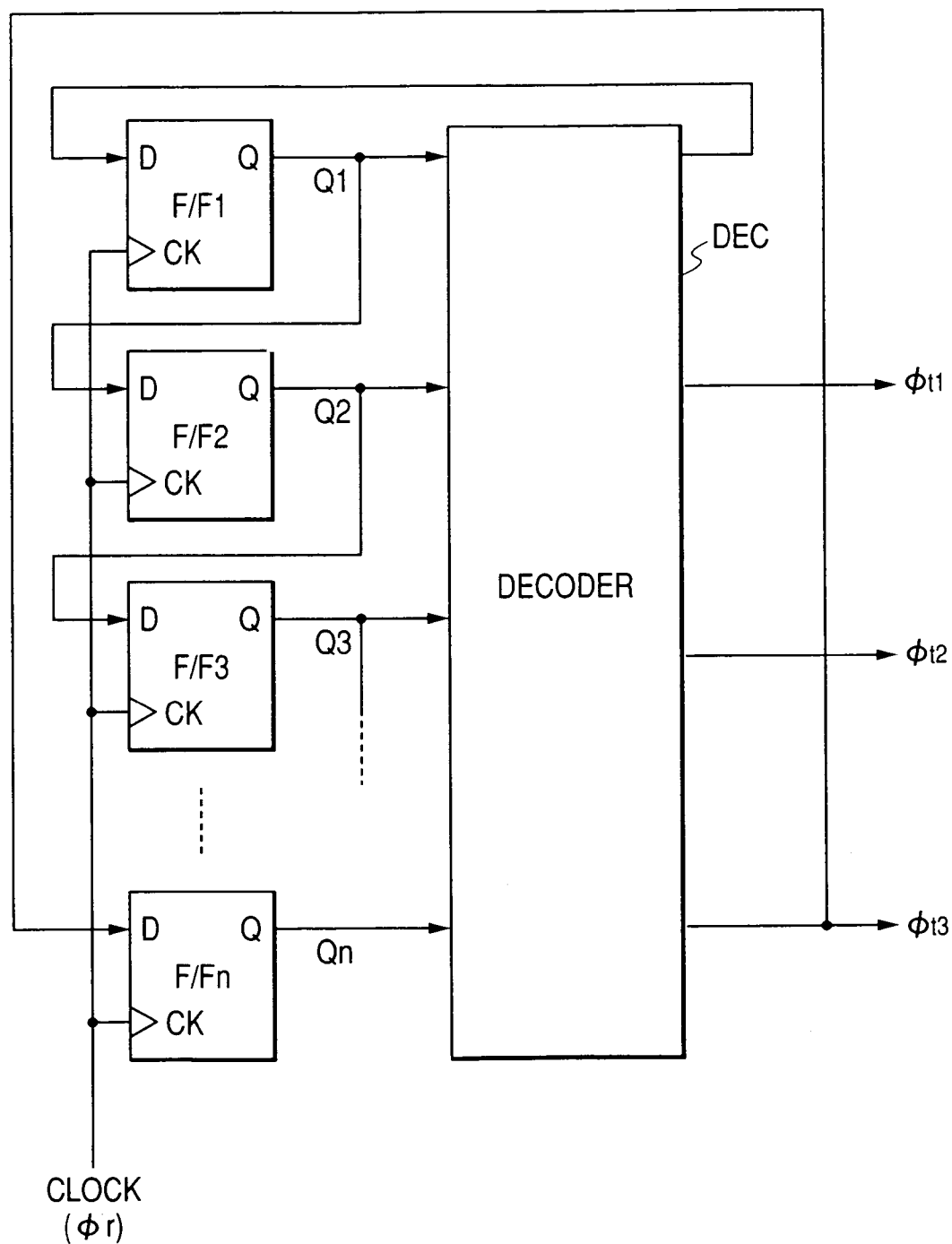
FIG. 6 illustrates a concrete example of a circuit configuration of a frequency counter.

FIG. 6 illustrates a basic configuration of the frequency counter 21 used in this embodiment. As shown in the drawing, the frequency counter 21 includes a plurality of cascaded D type flip flops F/F1, F/F2, F/F3, , F/Fn, each of which performs the latch operation by the clock signal ($\Phi$r), and a decoder DEC that decodes outputs Q1, Q2, Q3, , Qn from these flip flops to generate timing signals $\Phi$t1, $\Phi$t2, $\Phi$t3, , $\Phi$tn.

In this frequency counter 21, the output Q1 from the flip flop F/F1 varies by double the cycle of the clock signal ($\Phi$r), the output Q2 from the F/F2 varies by double the cycle of the output Q1 from the F/F1, and the output Q3 from the F/F3 varies by double the cycle of the output Q2 from the F/F2. Therefore, if the decoder DEC is designed in a manner that any output from the decoder DEC varies from the Low level to the High level when the outputs Q1 to Qn from the flip flops F/F1 to F/Fn comes to a certain combination, it will be possible to make the decoder DEC output the high level signals $\Phi$t1, $\Phi$t2, $\Phi$t3, at an arbitrary timing of 2.5 μs or 5 μs. These timing signals $\Phi$t1, $\Phi$t2, $\Phi$t3, are supplied to the control circuit 26 in FIG. 1. Thereby, the control circuit 26 is able to know the discrimination timing in the discrimination circuit 22, and the band switching timing of the VCO in the band switching circuit 23. Here, the decoder DEC in FIG. 6 can be regarded as the control circuit 26 illustrated in FIG. 1, or a part of it.

And, taking a close look at the part of the flip flops F/F1 to F/F3, it finds that the part has the same configuration as a frequency divider. In the embodiment in FIG. 1, the fixed frequency divider 14 needs to divide the frequency 26 MHz of the clock signal $\Phi$r into 1/65 the frequency (2.5 μs in terms of time). In contrast, the frequency counter 21 has to clock a still longer time (at least 20 μs). Therefore, to configure the frequency counter 21 to be able to count 20 μs, for example, and to use a part of the flip flops of the frequency counter 21 will be possible of making the frequency counter 21 perform the 1/65 frequency dividing operation. This is the reason for having explained that the frequency counter 21 and the fixed frequency divider 14 share part of the circuit. Since both of them share part of the circuit in this manner, the fixed frequency divider 14 is necessarily laid out at a closer position to the control circuit 26 (decoder DEC) than the variable frequency divider 12.

Next, in order to correct a discrimination error resulting from a discrepancy in the reset operation between the variable frequency divider 12 and the fixed frequency divider 14, an offset is added to determine the final selective band, and the necessity of this offsetting will be explained.

Figure 5A:
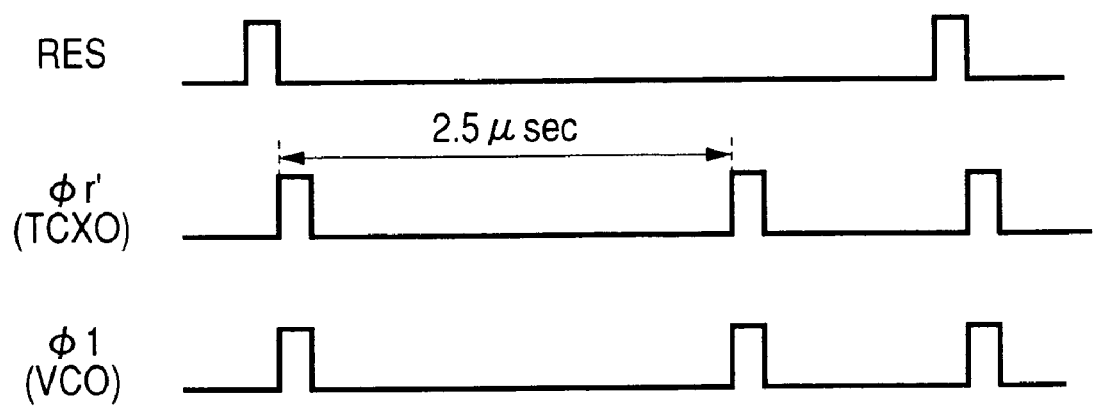
FIG. 5A illustrates the reset timing of the same in the PLL circuit that was examined prior to this invention.

In the automatic band selecting circuit 20 of this embodiment, the discrimination circuit 22 discriminates whether the rise of the output pulse □1 from the variable frequency divider 12 is in lead or lag to the rise of the output pulse $\Phi$r' from the fixed frequency divider 14. Now, if there is no discrepancy in the reset operation between the variable frequency divider 12 and the fixed frequency divider 14, the rise of the output pulse $\Phi$1 from the variable frequency divider 12 coincides with the rise of the output pulse $\Phi$r' from the fixed frequency divider 14 at the reset operation by the reset signal RES, as shown in FIG. 5A. Accordingly, it is possible to accurately perform the discrimination after 2.5 μs as to whether the phase is in lead or lag.

Figure 5B:
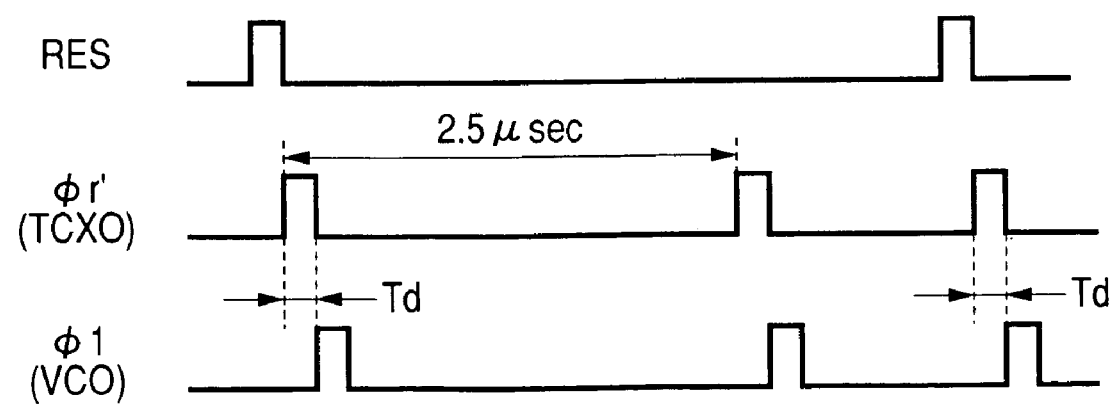
FIG. 5B illustrates the reset timing of the same in the PLL circuit in FIG. 1.

In contrast, if there is a discrepancy in the reset operation between the variable frequency divider 12 and the fixed frequency divider 14, and the variable frequency divider 12 is reset in lag, the rise of the output pulse $\Phi$1 from the variable frequency divider 12 is in lag to the rise of the output pulse $\Phi$r' from the fixed frequency divider 14 at the reset operation, as shown in FIG. 5B. Accordingly, it is impossible to accurately perform the discrimination as to whether the phase is in lead or lag. That is, when the reset operation of the variable frequency divider 12 is performed in delay, even if the cycle of the output pulse $\Phi$1 from the variable frequency divider 12 is equal to the cycle of the output pulse $\Phi$r' from the fixed frequency divider 14, and it has to be determined as a selective band at that moment, the discrimination circuit 22 will discriminate that the rise of the output pulse $\Phi$1 is in delay, and will supply the band switching circuit 23 with a demand to select a band of a shorter cycle (a higher frequency).

In consideration for these circumstances, the automatic band selecting circuit 20 of this embodiment adds an offset to a signal (code) for designating a band that was selected on the basis of a result discriminated while a delay by the reset signal RES is contained as it is. Thereby, the automatic band selecting circuit 20 is made to select a band lower by a frequency equivalent to an offset equal to a delay Td as a final usable band, instead of a band determined on the basis of the discrimination result by the discrimination circuit 22. With regard to the offset value set from the outside, a mean delay Td is measured in advance by an inspection, the offset value equal to it is calculated, and an actually set offset value is determined in consideration for the dispersion of individual products.

Now, in order to compensate the delay Td of transmission by the reset signal RES to the variable frequency divider 12, it is conceivable to install a delay circuit for giving a delay equal to the Td on the supply path of the reset signal RES from the control circuit 26 to the variable frequency divider 12. However in the system to install such a delay circuit, there is a fear that the dispersion of delay time by the delay circuit resulting from the production dispersion makes an accurate discrimination impossible. In this embodiment, however, an offset is given from the outside to shift a selective band in accordance with the offset; therefore, it is possible to absorb the dispersion of the delay time Td of transmission by the reset signal RES due to the production dispersion by varying the offset value given from the outside, and to select a most suitable band.

In addition, the automatic band selecting circuit 20 of this embodiment is configured such that, after the eighth discrimination, the selective band of the VCO 11 is switched without resetting the variable frequency divider 12 and the fixed frequency divider 14, the switch 18 is switched into the output terminal of the charge pump 16 from the fixed voltage VDC to close the PLL loop, and the VCO 11 is shifted into a feedback control state.

In a general control method of the PLL, the variable frequency divider 12 and the fixed frequency divider 14 are reset, when a usable band is determined, the band switching control signals VB0 through VB7 are supplied to the VCO 11, and the band is set. However, in such a system that contains a difference between the reset timing of the variable frequency divider 12 and the reset timing of the fixed frequency divider 14 as the PLL circuit in this embodiment, to reset the variable frequency divider 12 and the fixed frequency divider 14 when setting the band of the VCO will delay the reset operation to the variable frequency divider 12; thereby, it will make the phase comparator 15 output a charge-up signal to greatly vary the control voltage Vt to the VCO, and it will create a possibility of extending the time required for the frequency pulling-in of the PLL. In this embodiment, however, the switch 18 is switched after the eighth discrimination, without resetting the variable frequency divider 12 and the fixed frequency divider 14. Therefore, the band switching operation is carried out in a state that the loop during the band switching is retained as it is. In consequence, the time required for the frequency pulling-in of the PLL can be shortened.

Figure 7:
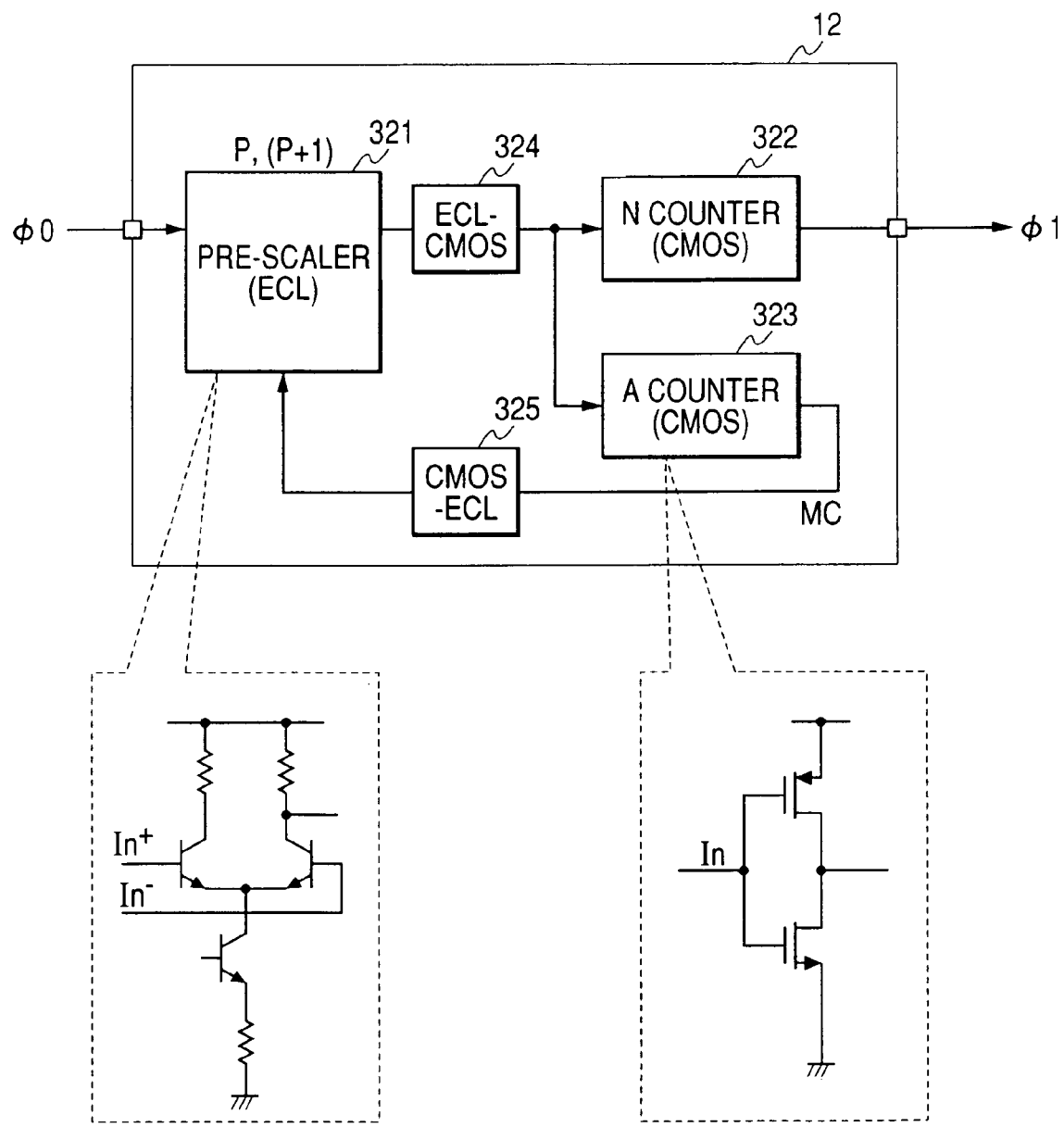
FIG. 7 illustrates a concrete example of a circuit configuration of a variable frequency divider.

FIG. 7 illustrates a circuit configuration of the variable frequency divider 12. The variable frequency divider 12 of this embodiment is designed to use the so-called modulo-n counter. The variable frequency divider 12 includes a pre-scaler 321 that can divide the frequency of the oscillation signal $\Phi 0$ from the VCO 11 into 1/P or 1/(P+1) of the frequency, an N counter 322 and an A counter 323 constituting a modulo counter, an ECL-CMOS level shifter 324 that gives a level shifting to the output signal from the pre-scaler 321, and a CMOS-ECL level shifter 325 that gives a level shifting to a frequency dividing ratio switching signal MC supplied from the A counter 323 to the pre-scaler 321.

The method of dividing the frequency of the oscillation signal by the modulo-n counter composed of the pre-scaler 321, N counter 322, and A counter 323 is the well-known technique. The pre-scaler 321 is configured to be possible of the frequency dividing by two different frequency dividing ratios such as 1/16 and 1/17, and switches one frequency dividing ratio into the other by a count termination signal from the A counter 323. The N counter 322 and A counter 323 are a programmable counter. The N counter 322 holds integral parts acquired by dividing a desired frequency (the oscillation frequency f0 of the VCO desirably attained as the output) by a frequency fr of the reference oscillation signal $\Phi r$ and a first frequency dividing ratio (for example P=17) of the pre-scaler 321; and the A counter 323 holds the remainders (MOD). Both the counters terminate the counting operation when counting the values held in the counters, and perform the counting of set values again.

While the pre-scaler 321 and the modulo-n counter operate according to such a process, first the pre-scaler 321 divides the frequency of the oscillation signal from the VCO 11 into 1/16 the frequency, and the A counter 323 counts the output thereof until the set value. Then, the A counter 323 outputs the count termination signal MC (frequency dividing ratio switching signal MC), and the signal MC switches the operation of the pre-scaler 321. Until the A counter 323 counts the set value again, the pre-scaler 321 divides the frequency of the oscillation signal from the VCO 11 into 1/17 the frequency. Carrying out such operations, the modulo-n counter becomes able to divide the frequency not only by the integral ratio, but also by a ratio with a decimal place.

The pre-scaler 321 is configured with an ECL circuit in this embodiment, and the N counter 322 and A counter 323 are configured with a CMOS circuit. The frequency counter 21 and the fixed frequency divider 14 are also configured with a CMOS circuit. Since the frequency of the oscillation signal from the VCO 11 that the pre-scaler 321 has to divide is the order of GHz, only a high speed ECL circuit can divide the frequency. On the other hand, since the signal frequency that the N counter 322 and A counter 323 have to divide is some 10 MHz to some 100 MHz having been divided by the pre-scaler 321, and the frequency of the reference signal $\Phi r$ that the fixed frequency divider 14 has to divide is 26 MHz, a CMOS circuit can divide the frequency efficiently. That is the reason why the ECL circuit and CMOS circuits are blended in this embodiment.

Figure 8:
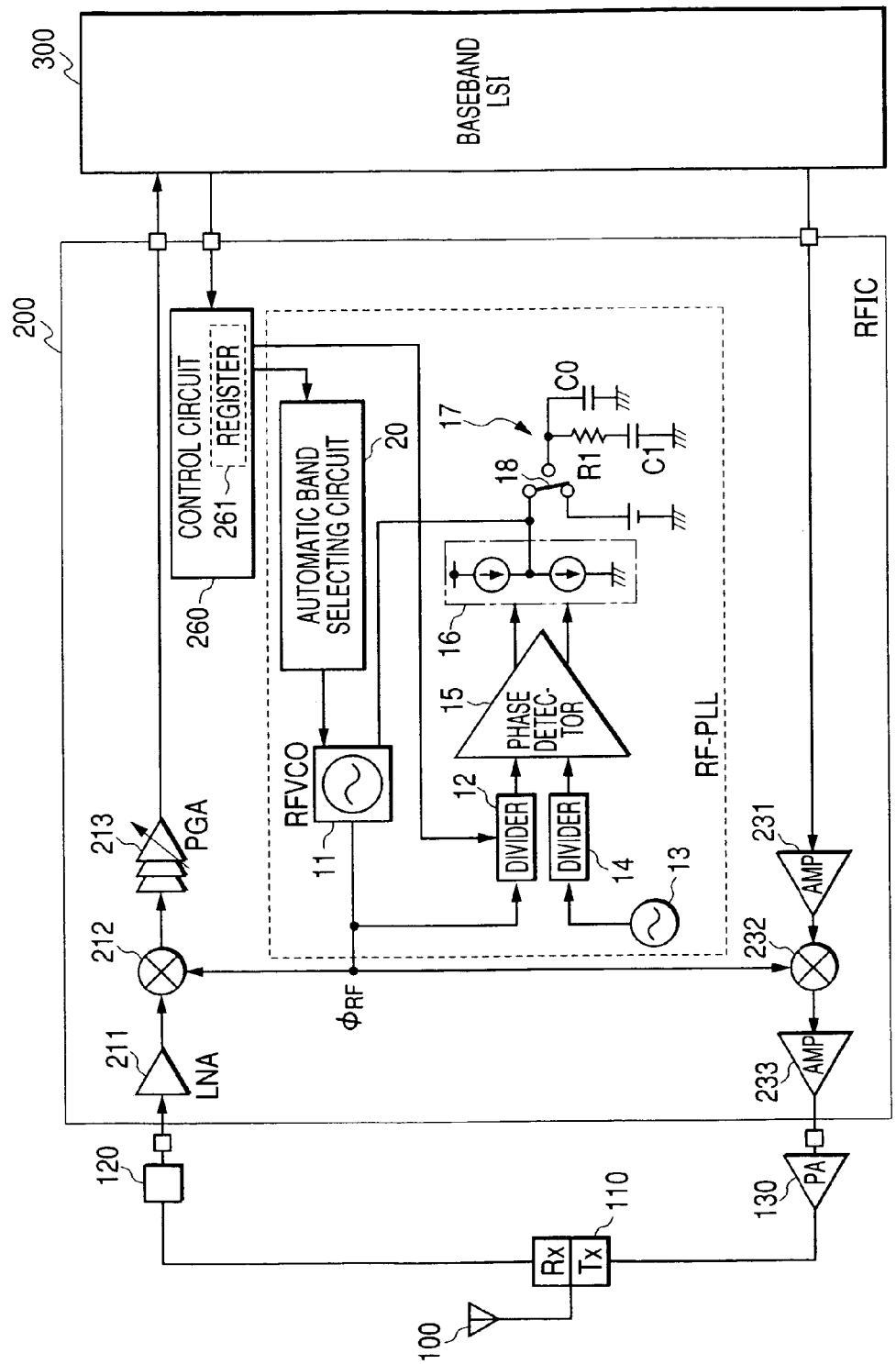
FIG. 8 is a block diagram illustrating a wireless communication semiconductor integrated circuit device (RF IC) to which the PLL circuit relating to the invention is applied, and a wireless communication system using the same.

Next with reference to FIG. 8, will be described one embodiment of a wireless communication semiconductor integrated circuit device (RF IC) to which the PLL circuit of the above embodiment is applied, and a wireless communication system of a mobile terminal using the same. In this embodiment, the PLL circuit of the above embodiment is applied to an RF IC of the so-called direct conversion system. In FIG. 8, the same circuits and elements as the circuits and elements shown in FIG. 1 are given the same symbols, and repeated explanations will be omitted.

The wireless communication system shown in FIG. 8 includes an antenna 100 that receives and transmits radio waves, a switch 110 that switches reception and transmission, a band pass filter 120 composed of an SAW filter and the like that eliminates undesired waves from a reception signal, an RF power amplifier 130 that amplifies a transmission signal, an RF IC 200 that demodulates a reception signal and modulates a transmission signal, and a base band circuit 300 that performs a base band processing, such as converting transmission data into I, Q signals and extracting reception data from demodulated I, Q signals, and that controls the RF IC 200. In this embodiment, the RF IC 200 and the base band circuit 300 are each formed on separate semiconductor chips as separate semiconductor integrated circuits. In place of the switch 110 that switches reception and transmission, a duplexer (demultiplexer) may be used; and in that case, the band pass filter 120 can be omitted.

The RF IC 200 of this embodiment is roughly divided into a reception system circuit, a transmission system circuit, and a control system circuit composed of circuits common to the transmission and reception system circuits, such as the control circuit and clock circuit, etc.

The reception system circuit includes a low noise amplifier 211 that amplifies the reception signal, a mixer 212 that synthesizes an oscillation signal $\Phi RF$ generated by an RF oscillator (RFVCO) and a reception signal amplified by the low noise amplifier 211 to demodulate and down-convert the reception signal, and a high gain amplifier (PGA) 213 that amplifies demodulated I, Q signals each and outputs the results to the base band circuit 300.

The transmission system circuit includes an amplifier 231 that amplifiers I, Q signals supplied from the base band circuit 300, a mixer 232 that synthesizes the amplified I, Q signals and the oscillation signal $\Phi RF$ generated by the RF oscillator (RFVCO) to modulate and up-convert the I, Q signals, and an amplifier 233 that amplifies the modulated signals.

As an RF-PLL for generating the high-frequency oscillation signal $\Phi RF$ mixed with the reception and transmission signal in the mixers 212 and 232, this embodiment employs the PLL circuit as shown in FIG. 1. The RF IC 200 includes a control circuit 260 that generates signals for controlling the RF-PLL, the reception system circuit, and the transmission system circuit on the basis of signals from the base band circuit 300.

The control circuit 260 includes a register 261 composed of a control register and a data register and so forth. The aforementioned offset values and oscillation frequencies (frequency dividing ratios [N]) are set to this register 261 on the basis of the signals from the base band circuit 300. The values held in the register 261 are supplied to the register 24 for setting the offset, contained in the automatic band selecting circuit 20 of the RF-PLL, and the variable frequency divider 12. Further, based on the command (command codes, etc.) from the base band circuit 300, the signal OFC for controlling to switch the oscillation frequency is supplied to the automatic band selecting circuit 20 from the control circuit 260.

Here, the reference frequency oscillator 13 that generates the reference oscillation signal Φr has an externally attached quartz resonator connected. A frequency such as 26 MHz or 13 MHz is selected for the reference oscillation signal Φr. The reason is that the quartz resonator with such frequency is a universal component, and is easily available.

The control register in the control circuit 260 retains control bits for starting the usable band selecting operation of the RFVCO 11 in the RF-PLL, and bit fields for designating modes such as a reception mode, transmission mode, idle mode, etc., which is not specifically restricted. Here, the idle mode is a mode that the system comes into a sleep state, in which only a part of the circuits operate and great part of the circuits including at least the oscillators halt. The oscillation frequency of the RFVCO 11 in the reception mode is set to a frequency different from that in the transmission mode.

The invention made by the inventors being described in detail based on the embodiment, the invention is not confined to it. For example, the above embodiment is configured to switch the VCO 11 into any one of 256 bands; however, the number of the bands may be 128, 512, or the like. Since the wireless communication system of the above embodiment assumes the direct conversion system, the embodiment quotes the system in which the PLL circuit of the above embodiment is applied to the RF-PLL including the RFVCO, however it is not restricted to this. The PLL circuit of the above embodiment can also be applied to an RF-PLL and an IF-PLL in the communication system of the so-called offset PLL system, which includes an IF-VCO for generating an oscillation signal of an intermediate frequency and a TX-VCO for transmission, modulates a transmission signal by an intermediate-frequency signal, mixes a signal fed back from the TX-VCO with an oscillation signal from the RF-VCO to generate the intermediate-frequency signal, compares the phases of this signal with a signal having been modulated to generate an oscillation control signal to the TX-VCO. The PLL circuit of the above embodiment can also be applied to an RF-PLL and an IF-PLL in the communication system of the so-called polar loop system that splits the transmission signal into a phase component and an amplitude component to carry out the control.

In the above embodiment, the fixed frequency divider 14 is laid out close to the control circuit 26, compared to the variable frequency divider 12. However, there can be a case in which a part of the control circuit 26 is shared by the other circuit. In such a case, the variable frequency divider 12 can be laid out close to the control circuit 26, compared to the fixed frequency divider 14. Further, a buffer, for example, can be inserted between the fixed frequency divider and the control circuit and/or between the variable frequency divider and the control circuit. In such cases, the reset operation of the fixed frequency divider 14 can be delayed instead of the variable frequency divider 12; and the above band switching circuit 23 will necessarily select a band of longer cycle (lower frequency). In this case, it is only needed to select a band of a higher frequency in comparison to the band given by the band switching circuit 23, by adding (subtracting) the offset retained in the register 24 to the output from the band switching circuit 23. As the offset imparting circuit 25, to use a subtracter instead of the adder will accomplish the above subtraction. And instead of using a subtracter, if the register 24 is configured in a manner that the offset outputted from the register 24 shows a negative value, the above subtraction will be accomplished even with the adder. To make the offset imparting circuit 25 into an adder or subtracter may be decided in the same manner as the calculation of the offset values, by a pre-inspection to determine whether the band given by the band switching circuit 23 is low or high in the frequency compared to a desired band.

The above descriptions have been made to the case in which the invention made by the inventors is applied to the RF IC used in a wireless communication system such as a mobile telephone, as the background applicable field; however, the invention is not restricted to this. The invention can be applied to an RF IC for a wireless LAN, and can also be applied to an RF IC having a PLL circuit that generates an RF signal being mixed with a reception signal and a transmission signal, that executes the frequency conversion and the modulation/demodulation.

What is claimed is:

1. A semiconductor integrated circuit device for wireless communication, comprising:

oscillation means for having an ability of oscillations in a plurality of frequency bands;

variable frequency dividing means for dividing a frequency of an output signal from the oscillator by a designated frequency dividing ratio;

set frequency dividing means for dividing a predetermined frequency of a reference signal by a predetermined frequency dividing ratio;

phase comparing means for comparing a phase of an output signal from the variable frequency dividing means with a phase of an output signal from the set frequency dividing means to detect a difference between the phases;

filter means for generating a voltage according to an output from the phase comparing means; and loop means for controlling the voltage generated by a filter means controls oscillation frequencies of the oscillation means, wherein the semiconductor integrated circuit device further comprising:

switch means for supplying a predetermined potential to the oscillator as a control voltage with the loop means open;

band selection means for comparing the phase of the output signal from the variable frequency dividing means and the phase of the output signal from the set frequency dividing means in a state that the switch means supply the predetermined potential to the oscillator, and selects an oscillation frequency band of the oscillation means; and register means for accepting, in order to prevent wrong selection of the oscillation frequency band due to a time lag in releasing the variable frequency dividing means and the set frequency dividing means from being reset, setting of a value by which another oscillation frequency band different from the selected oscillation frequency band is selected.

2. The semiconductor integrated circuit device for wireless communication according to claim 1, wherein the band selection means includes a band switching circuit which compares the phase of the output signal from the variable frequency dividing means with the phase of the output signal from the set frequency dividing means and generates a frequency band instruction signal for the oscillation means, and offset imparting circuit which adds band offset value set to the register means to the frequency band instruction signal, and wherein the band selection means generates a signal for designating a final selective frequency band.

3. A semiconductor integrated circuit device for wireless communication, comprising:

oscillation means for having an ability of oscillations in a plurality of frequency bands, variable frequency dividing means for dividing a frequency of an output signal from the oscillator by a designated frequency dividing ratio, set frequency dividing means for dividing a predetermined frequency of a reference signal by a predetermined frequency dividing ratio, phase comparing means for comparing a phase of an output signal from the variable frequency dividing means with a phase of an output signal from the set frequency dividing means to detect a difference between the phases, filter means for generating a voltage according to an output from the phase comparing means, and loop means for controlling the voltage generated by a filter means controls oscillation frequencies of the oscillation means, wherein the semiconductor integrated circuit device further comprising:

switch means for supplying a predetermined potential to the oscillator as a control voltage with the loop open;

band selection means for comparing the phase of the output signal from the variable frequency dividing means and the phase of the output signal from the set frequency dividing means in a state that the switch means supply the predetermined potential to the oscillator, and selects an oscillation frequency band of the oscillation means; and register means for accepting, in order to prevent wrong selection of the oscillation frequency band due to a time lag in releasing the variable frequency dividing means and the set frequency dividing means from being reset, setting of a value by which another oscillation frequency band different from the selected oscillation frequency band is selected, wherein the band selection means repeatedly executes comparing the phase of the output signal from the variable frequency dividing means with the phase of the output signal from the set frequency dividing means, and varying a selective frequency based on the comparison result to select a final selective frequency band by means of bisection algorithm.

4. The semiconductor integrated circuit device for wireless communication according to claim 1, wherein the filter means includes capacitive elements and resistive elements, and the capacitive elements and resistive elements are formed on the same semiconductor chip as one on which are formed elements constituting the oscillation means, the variable frequency dividing means, and the phase comparing means.

5. A semiconductor integrated circuit device for wireless communication, comprising:

oscillation means for having an ability of oscillations in a plurality of frequency bands, variable frequency dividing means for dividing a frequency of an output signal from the oscillator by a designated frequency dividing ratio, set frequency dividing means for dividing a predetermined frequency of a reference signal by a predetermined frequency dividing ratio, phase comparing means for comparing a phase of an output signal from the variable frequency dividing means with a phase of an output signal from the set frequency dividing means to detect a difference between the phases, filter means for generating a voltage according to an output from the phase comparing means, and loop means for controlling the voltage generated by a filter means controls oscillation frequencies of the oscillation means, wherein the semiconductor integrated circuit device further comprising:

switch means for supplying a predetermined potential to the oscillator as a control voltage with the loop open;

band selection means for comparing the phase of the output signal from the variable frequency dividing means and the phase of the output signal from the set frequency dividing means in a state that the switch means supply the predetermined potential to the oscillator, and selects an oscillation frequency band of the oscillation means; and register means for accepting, in order to prevent wrong selection of the oscillation frequency band due to a time lag in releasing the variable frequency dividing means and the set frequency dividing means from being reset, setting of a value by which another oscillation frequency band different from the selected oscillation frequency band is selected, wherein the variable frequency dividing means includes bipolar transistors at least at a first stage thereof, and the fixed frequency divider includes CMOS transistors, and wherein the integrated circuit device further comprising:

a level shift means for converting a level of a reset signal being supplied to the variable frequency dividing means.

6. The semiconductor integrated circuit device for wireless communication according to claim 1, wherein the variable frequency dividing means and the set frequency dividing means share part of each other.

7. The semiconductor integrated circuit device for wireless communication according to claim 1, wherein the variable frequency dividing means and the set frequency dividing means are laid out with different distances from a circuit that outputs a reset signal for resetting these frequency dividing means.

8. A mobile communication system comprising the semiconductor integrated circuit device for wireless communication according to claim 1, and a base band means for executing a base band processing of transmission and reception data, wherein a value set to the register is supplied to the semiconductor integrated circuit device from the base band means.

9. The mobile communication system according to claim 8, wherein a value for designating a frequency dividing ratio of the variable frequency dividing means is supplied to the semiconductor integrated circuit device from the base band means.

10. A semiconductor integrated circuit device for wireless communication, comprising:

oscillation means for having an ability of oscillations in a plurality of frequency bands, first frequency dividing means for dividing a frequency of an output signal from the oscillation means, second frequency dividing means for dividing a frequency of a predetermined signal, phase comparing means for comparing a phase of an output signal from the first frequency dividing means with a phase of an output signal from the second frequency dividing means to detect a difference between the phases, filter means for generating a voltage according to an output from the phase comparing means, and loop means for controlling a voltage generated by the filter means controls oscillation frequencies of the oscillation means, wherein the semiconductor integrated circuit device further comprising:

switch means capable of supplying a predetermined potential to the oscillation means as a control voltage with the loop means open;

band specify means for comparing the phase of the output signal from the first frequency dividing means with the phase of the output signal from the second frequency dividing means with the predetermined potential supplied to the oscillator, and specifies an oscillation frequency band of the oscillation means; and register means for setting of a value by which another oscillation frequency band different from the oscillation frequency band specified by the band specify means is selected as an oscillation frequency band of the oscillation means.

11. The semiconductor integrated circuit device for wireless communication according to claim 10, wherein the band specify means includes an offset imparting circuit which outputs a signal indicating the oscillation frequency band of the oscillation means, a band switching circuit which compares the phase of the output signal from the first frequency dividing means with the phase of the output signal from the second frequency dividing means, and generates a signal for designating the frequency band to be selected, by adding a signal indicating a band offset value set to the register means to the signal indicating the oscillation frequency band of the oscillation means.

12. A semiconductor integrated circuit device for wireless communication, comprising:

oscillation means for having an ability of oscillations in a plurality of frequency bands, a first frequency dividing means for dividing a frequency of an output signal from the oscillation means, second frequency dividing means for dividing a frequency of a predetermined signal, phase comparing means for comparing a phase of an output signal from the first frequency dividing means with a phase of an output signal from the second frequency dividing means to detect a difference between the phases, filter means for generating a voltage according to an output from the phase comparing means, and loop means for controlling a voltage generated by the filter means controls oscillation frequencies of the oscillation means, wherein the semiconductor integrated circuit device further comprising:

switch means capable of supplying a predetermined potential to the oscillation means as a control voltage with the loop means open;

band specify means for comparing the phase of the output signal from the first frequency dividing means with the phase of the output signal from the second frequency dividing means with the predetermined potential supplied to the oscillator, and specifies an oscillation frequency band of the oscillation means; and register means for setting of a value by which another oscillation frequency band different from the oscillation frequency band specified by the band specify means is selected as an oscillation frequency band of the oscillation means, wherein the band specify means repeatedly executes comparing the phase of the output signal from the first frequency dividing means with the phase of the output signal from the second frequency dividing means, specifying a band based on the comparison result, and varying the frequency to specify the frequency band by means of bisection algorithm.

13. The semiconductor integrated circuit device for wireless communication according to claim 10, wherein the filter means includes capacitive elements and resistive elements, and the capacitive elements and resistive elements are formed on the same semiconductor chip as one on which are formed elements contained in the oscillation means, the first frequency dividing means, the second frequency dividing means, and the phase comparing means.

14. A semiconductor integrated circuit device for wireless communication, comprising:

oscillation means for having an ability of oscillations in a plurality of frequency bands, first frequency dividing means for dividing a frequency of an output signal from the oscillation means, second frequency dividing means for dividing a frequency of a predetermined signal, a phase comparing means for comparing a phase of an output signal from the first frequency dividing means with a phase of an output signal from the second frequency dividing means to detect a difference between the phases, filter means for generating a voltage according to an output from the phase comparing means, and loop means for controlling a voltage generated by the filter means controls oscillation frequencies of the oscillation means, wherein the semiconductor integrated circuit device further comprising:

switch means capable of supplying a predetermined potential to the oscillation means as a control voltage with the loop means open;

band specify means for comparing the phase of the output signal from the first frequency dividing means with the phase of the output signal from the second frequency dividing means with the predetermined potential supplied to the oscillator, and specifies an oscillation frequency band of the oscillation means; and register means for setting of a value by which another oscillation frequency band different from the oscillation frequency band specified by the band specify means is selected as an oscillation frequency band of the oscillation means, wherein the first frequency dividing means includes bipolar transistors at least at a first stage thereof, and the second frequency dividing means includes CMOS transistors, and wherein the semiconductor integrated circuit device further comprising:

a level shift means for converting a level of a reset signal being supplied to the first frequency dividing means.

15. The semiconductor integrated circuit device for wireless communication according to claim 10, wherein the first frequency dividing means and the second frequency dividing means share part of each other.

16. The semiconductor integrated circuit device for wireless communication according to claim 10, wherein the first frequency dividing means and the second frequency dividing means are laid out with different distances from a circuit that outputs a reset signal for resetting the first and the second frequency dividing means.

17. A mobile communication system comprising:
the semiconductor integrated circuit device for wireless communication according to claim 10, and a base band means for executing a base band processing of transmission and reception data,
wherein a value set to the register is supplied to the wireless communication semiconductor integrated circuit device from the base band means.

18. The mobile communication system according to claim 17, wherein a value for designating a frequency dividing ratio of the first frequency dividing means is supplied to the semiconductor integrated circuit device from the base band means.

* * * * *